(12) United States Patent
Kuang

(10) Patent No.: US 10,014,493 B2
(45) Date of Patent: Jul. 3, 2018

(54) HEATING SOURCE AND EVAPORATOR OF ORGANIC LIGHT EMITTING DIODE

(71) Applicant: Shenzhen China Star Optoelectronics Technology Co., Ltd., Shenzhen, Guangdong (CN)

(72) Inventor: Youyuan Kuang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 268 days.

(21) Appl. No.: 14/891,377

(22) PCT Filed: Jul. 13, 2015

(86) PCT No.: PCT/CN2015/083869
§ 371 (c)(1),
(2) Date: Nov. 16, 2015

(87) PCT Pub. No.: WO2016/206141
PCT Pub. Date: Dec. 29, 2016

(65) Prior Publication Data
US 2017/0222189 A1 Aug. 3, 2017

(30) Foreign Application Priority Data
Jun. 24, 2015 (CN) .......................... 2015 1 0355332

(51) Int. Cl.
C23C 14/00 (2006.01)
H01L 51/56 (2006.01)
(Continued)

(52) U.S. Cl.
CPC ............ H01L 51/56 (2013.01); C23C 14/042 (2013.01); C23C 14/243 (2013.01); C23C 14/26 (2013.01);
(Continued)

(58) Field of Classification Search
None
See application file for complete search history.

(56) References Cited

U.S. PATENT DOCUMENTS 5,329,098 A * 7/1994 Howard ................ F24H 3/0405
206/350
5,432,341 A * 7/1995 Gspann ................ C23C 14/221
250/251
(Continued)

FOREIGN PATENT DOCUMENTS

CN 2814869 Y 9/2006
CN 201533421 U 7/2010
(Continued)

Primary Examiner — Thor Campbell
(74) Attorney, Agent, or Firm — Andrew C. Cheng

(57) ABSTRACT

The present invention discloses a heating source, applied in an evaporator of organic light emitting diode to heat a heating container in the evaporator, wherein the heating source comprises a heating coil and a protective component, and the protective component is insulation material, and two ends of the heating coil are connected to a power source to receive voltages to generate heat, and the protective component is located on the heating coil to restrict a deformation range of the heating coil for restricting contact of two adjacent heater strips in the heating coil and preventing the short circuit the two adjacent heater strips. Therefore, the present invention reduces the possibility of the heating coil short circuit and raises the stability of the heating coil, and thus, the stability of the evaporator applied with the heating coil can be provided.

14 Claims, 2 Drawing Sheets

(51) Int. Cl.
*C23C 14/26* (2006.01)
*C23C 14/24* (2006.01)
*C23C 14/04* (2006.01)
*H01L 51/00* (2006.01)

(52) U.S. Cl.
CPC ........ *H01L 51/001* (2013.01); *H01L 51/0011* (2013.01)

(56) References Cited

U.S. PATENT DOCUMENTS

| | | | | |
|---|---|---|---|---|
| 7,922,820 | B2* | 4/2011 | Ryu | C23C 14/243 118/720 |
| 8,025,733 | B2* | 9/2011 | Keum | C23C 14/12 118/663 |
| 9,790,588 | B2* | 10/2017 | Liu | C23C 14/243 |
| 2004/0040947 | A1* | 3/2004 | Cho | D06F 39/04 219/221 |
| 2006/0003099 | A1* | 1/2006 | Jabbour | C23C 14/12 427/248.1 |
| 2007/0022955 | A1* | 2/2007 | Bender | C23C 14/243 118/726 |
| 2016/0258051 | A1* | 9/2016 | Liu | C23C 14/26 |
| 2017/0025643 | A1* | 1/2017 | He | C23C 14/243 |
| 2017/0226627 | A1* | 8/2017 | Jin | C23C 14/243 |

FOREIGN PATENT DOCUMENTS

| | | |
|---|---|---|
| CN | 103726022 U | 4/2014 |
| CN | 103779258 A | 5/2014 |
| CN | 204550788 U | 8/2015 |
| JP | 2009019762 A | 1/2009 |
| JP | 2012089557 A | 5/2012 |

* cited by examiner

HEATING SOURCE AND EVAPORATOR OF ORGANIC LIGHT EMITTING DIODE

CROSS REFERENCE

This application claims the priority of Chinese Patent Application No. 201510355332.6, entitled "Heating source and evaporator of organic light emitting diode", filed on Jun. 24, 2015, the disclosure of which is incorporated herein by reference in its entirety.

FIELD OF THE INVENTION

The present invention relates to an electronic technology field, and more particularly to a heating source and an evaporator of organic light emitting diode.

BACKGROUND OF THE INVENTION

The OLED (Organic Light-Emitting Diode) is the new generation solid self-emissive display technology. In comparison with liquid crystal display, it possesses advantages of ultra-thin, fast response, high contrast, low power consumption and etc. The industry has rapidly developed in the recent years. At present, the mainstream manufacture skill and method of the OLED is evaporation, which is to heat organic small molecule material in a vacuum chamber to be sublimated or gasified to be material vapor. Then, it is deposed on the glass substrate with the opens of the metal mask. With the evaporators of newer and newer generation appear, the utilized crucible becomes larger and larger. The heating coil of the heating source becomes larger and larger, too. The distribution of the coil also gets more and more integrated. Because the expanding with heat and contracting with cold of the heating coil itself, the crucible loaded with material experiencing expanding with heat and contracting with cold can cause the partial deformation of the crucible. The adjacent heater strips of the heating coil deform due to these external forces, which can results in the mutual contact and cementation. The short circuit of the entire heating source happens to cause the abnormal downtime of the evaporator and to seriously affect the stability of the evaporator.

SUMMARY OF THE INVENTION

An objective of the present invention is to provide a heating source and an evaporator of organic light emitting diode to reduce the possibility of the heating coil short circuit and raise the stability of the heating coil, and thus, the stability of the evaporator applied with the heating coil can be provided.

For realizing the aforesaid objective, the technical solution provided by the embodiments of the present invention is:

The present invention provides a heating source, applied in an evaporator of organic light emitting diode to heat a heating container in the evaporator, wherein the heating source comprises a heating coil and a protective component, and the protective component is insulation material, and two ends of the heating coil are connected to a power source to receive voltages to generate heat, and the protective component is located on the heating coil to restrict a deformation range of the heating coil for restricting contact of two adjacent heater strips in the heating coil.

The protective component comprises insulation bridges, and at least one insulation bridge is located between the two adjacent heater strips in the heating coil for restricting the contact of the two adjacent heater strips in the heating coil.

The insulation bridge is an insulation rigid uncut bar.

Material of the insulation bridge is C/Csi composite material.

An included angle between the insulation bridge and the two adjacent heater strips is 90 degrees.

The protective component further comprises an insulation lining, and the insulation lining is located between an inner wall of the heating coil and the heating container, and the insulation lining connects to each heater strip in the heating coil to restrict the deformation range of the heating coil for restricting the contact of the two adjacent heater strips in the heating coil.

The insulation lining is an insulation rigid uncut bar.

The heating source comprises a plurality of insulation linings, and the plurality of insulation linings are evenly distributed in an annular space between the inner wall of the heating coil and the heating container.

Material of the insulation lining is C/Csi composite material.

The present invention further provides an evaporator of organic light emitting diode, comprising a heating container and the aforesaid heating source, and the heating source is located at an outer side of the heating container to heat the heating container.

The heating source of the present invention is applied in an evaporator of organic light emitting diode to heat a heating container in the evaporator, wherein the heating source comprises a heating coil and a protective component, and the protective component is insulation material, and two ends of the heating coil are connected to a power source to receive voltages to generate heat, and the protective component is located on the heating coil to restrict a deformation range of the heating coil for restricting contact of two adjacent heater strips in the heating coil and preventing the short circuit the two adjacent heater strips. Therefore, the present invention reduces the possibility of the heating coil short circuit and raises the stability of the heating coil, and thus, the stability of the evaporator applied with the heating coil can be provided.

BRIEF DESCRIPTION OF THE DRAWINGS

In order to more clearly illustrate the embodiments of the present invention, the following figures will be described in the embodiments are briefly introduced. It is obvious that the drawings are only some embodiments of the present invention, those of ordinary skill in this field can obtain other figures according to these figures without paying the premise.

DETAILED DESCRIPTION OF PREFERRED EMBODIMENTS

For better explaining the technical solution and the effect of the present invention, the present invention will be further described in detail with the accompanying drawings in the specific embodiments.

Figure 1:
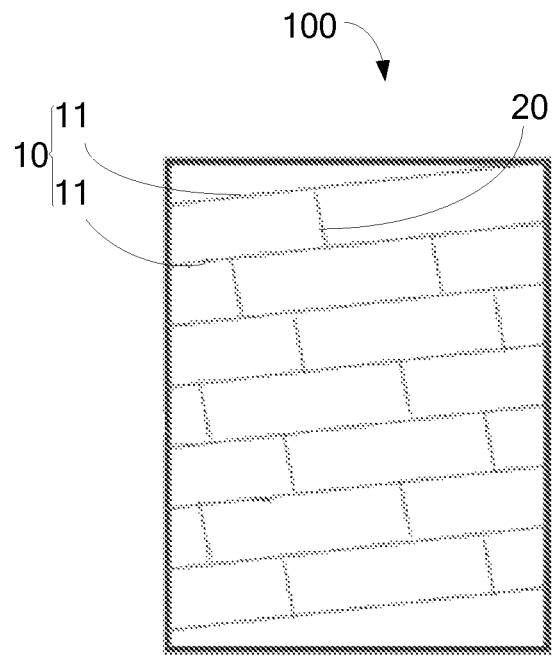
FIG. 1 is a plane diagram of a heating source provided by the first embodiment according to the first solution of the present invention.

Please refer to FIG. 1. The present invention provides a heating source 100 provided by the first embodiment according to the first solution of the present invention. The heating source 100 is applied in an evaporator of organic light emitting diode (not shown) to heat a heating container in the evaporator. The heating source 100 comprises a heating coil 10 and a protective component 20. The protective component 20 is insulation material. Two ends of the heating coil 10 are connected to a power source (not shown) to receive voltages to generate heat. The protective component 20 is located on the heating coil 10 to restrict a deformation range of the heating coil 10 for restricting contact of two adjacent heater strips 11 in the heating coil 10.

Specifically, the heat generated after the heating coil 10 receives voltages of the power source is employed to heat the heating container. The expanding with heat and contracting with cold of the heating coil 10 can result in the deformation of the heating container experiencing expanding with heat and contracting with cold. The deformation of the heating container can deliver the deforming force to the heating coil 10. It will result in the deformation of the heating coil 10. The heating source 100 comprises the protective component 20. The protective component 20 is located on the heating coil 10 to restrict a deformation range of the heating coil 10 for restricting contact of two adjacent heater strips 11 in the heating coil 10 for preventing the short circuit the two adjacent heater strips 11. Therefore, the present invention reduces the possibility of the heating coil 10 short circuit and raises the stability of the heating coil 10, and thus, the stability of the evaporator applied with the heating coil can be provided.

In this embodiment, the heating container is a crucible. The protective component 20 comprises insulation bridges. At least one insulation bridge is located between the two adjacent heater strips 11 in the heating coil 10 for restricting the contact of the two adjacent heater strips 11 in the heating coil 10.

Specifically, the insulation bridge is an insulation rigid uncut bar. The two ends of the rigid uncut bar are respectively connected to the connected two heater strips 11.

In this embodiment, material of the insulation bridge is C/Csi composite material. An included angle between the insulation bridge and the two adjacent heater strips 11 is 90 degrees.

Specifically, as the included angle between the insulation bridge and the two adjacent heater strips 11 is 90 degrees, the support force of the insulation bridge to the heater strips 11 at its two sides is the best. In other word, the result of preventing short circuit of the heater strips 11 at the two sides is the best.

In other embodiments, material of the insulation bridge can be adjusted on actual demands. The included angle between the insulation bridge and the two adjacent heater strips 11 can be adjusted on actual demands.

Figure 2:
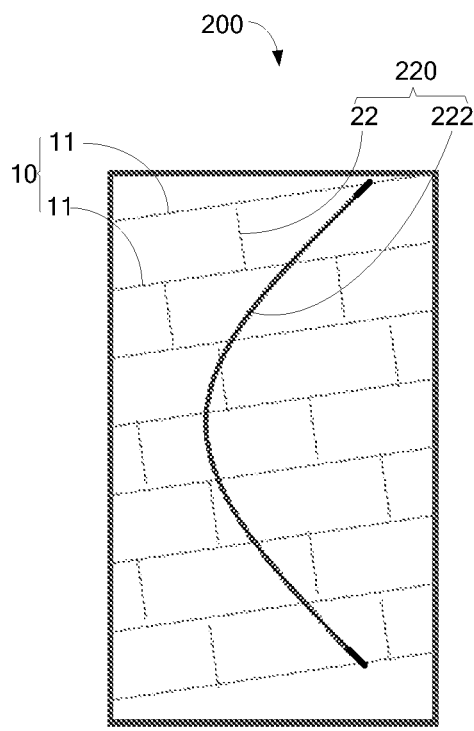
FIG. 2 is a plane diagram of a heating source provided by the second embodiment according to the first solution of the present invention.

Please refer to FIG. 2. The second embodiment according to the first solution of the present invention provides a heating source 200. The heating source 200 provided by the second embodiment is similar as the heating source 100 provided by the first embodiment. The difference between the two is: in the second embodiment, the protective component 220 further comprises an insulation lining 222. The insulation lining 222 is located between an inner wall of the heating coil 10 and the heating container, and the insulation lining 222 connects to each heater strip in the heating coil 10 to restrict the deformation range of the heating coil 10 for restricting the contact of the two adjacent heater strips 11 in the heating coil 10.

Specifically, the heat generated after the heating coil 10 receives voltages of the power source is employed to heat the heating container. The expanding with heat and contracting with cold of the heating coil 10 can result in the deformation of the heating container experiencing expanding with heat and contracting with cold. The deformation of the heating container can deliver the deforming force to the heating coil 10. It will result in the deformation of the heating coil 10. The protective component 220 further comprises the insulation lining 222. The insulation lining 222 is located between an inner wall of the heating coil 10 and the heating container, and the insulation lining 222 connects to each heater strip in the heating coil 10 to disperse the deforming force and to restrict the deformation range of the heating coil 10 for restricting the contact of the two adjacent heater strips in the heating coil 10 for preventing the short circuit the two adjacent heater strips 11. Therefore, the present invention reduces the possibility of the heating coil 10 short circuit and raises the stability of the heating coil 10, and thus, the stability of the evaporator applied with the heating coil can be provided.

Specifically, the insulation lining 222 is an insulation rigid uncut bar.

Furthermore, the heating source 200 can comprise a plurality of insulation lining 222. The plurality of insulation linings 222 are evenly distributed in an annular space between the inner wall of the heating coil 10 and the heating container. Therefore, the plurality of insulation linings 222 which are distributed as aforementioned has the better result of dispersing the deforming force for restricting the contact of the two adjacent heater strips in the heating coil 10 in a better way and for preventing the short circuit the two adjacent heater strips 11 in a better way.

In this embodiment, material of the insulation linings 222 is C/Csi composite material. In other embodiments, material of the insulation linings 222 can be adjusted on actual demands.

Specifically, in other embodiments, the heating source 200 can only comprise the insulation bridge or the insulation linings 222.

Figure 3:
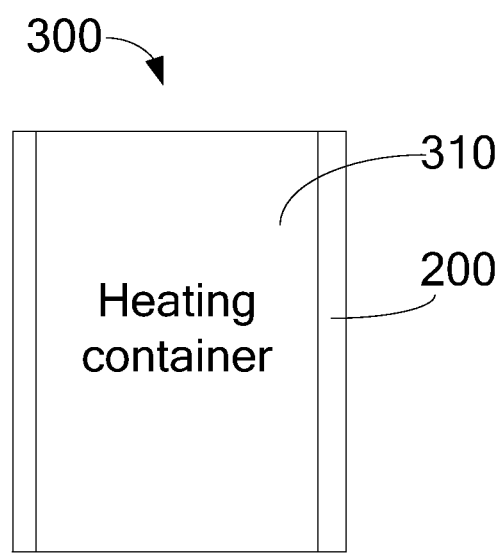
FIG. 3 is block diagram of an evaporator of organic light emitting diode provided by the preferred embodiment according to the second solution of the present invention.

Please refer to FIG. 3. The preferred embodiment according to the second solution of the present invention provides an evaporator 300 of organic light emitting diode. The evaporator 300 of organic light emitting diode comprises a heating container and a heating source. The heating source is located at an outer side of the heating container 310 to heat the heating container 310. In this embodiment, the heating source can be the heating source 200 provided by the second embodiment according to the first solution of the present invention. The structure and the function of the heating source has already described in the aforesaid second embodiment of the first solution in detail. The repeated description is omitted here.

In other embodiments, the heating source can be other heating source, such as the heating source 100 provided by the first embodiment according to the first solution of the present invention.

In this embodiment, the heat generated after the heating coil 10 receives voltages of the power source is employed to heat the heating container. The expanding with heat and contracting with cold of the heating coil 10 can result in the deformation of the heating container experiencing expanding with heat and contracting with cold. The deformation of the heating container can deliver the deforming force to the heating coil 10. It will result in the deformation of the heating coil 10. The heating source 100 comprises the protective component 20. The protective component 20 is employed to restrict a deformation range of the heating coil 10 for restricting contact of two adjacent heater strips 11 in the heating coil 10 for preventing the short circuit the two adjacent heater strips 11. Besides, the protective component 220 further comprises the insulation lining 222. The insulation lining 222 is located between an inner wall of the heating coil 10 and the heating container, and the insulation lining 222 connects to each heater strip in the heating coil 10 to disperse the deforming force and to restrict the deformation range of the heating coil 10 for restricting the contact of the two adjacent heater strips in the heating coil 10 for preventing the short circuit the two adjacent heater strips 11. Therefore, the present invention reduces the possibility of the heating coil 10 short circuit and raises the stability of the heating coil 10, and thus, the stability of the evaporator 300 applied with the heating coil can be provided.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A heating source, applied in an evaporator of organic light emitting diode to heat a heating container in the evaporator, wherein the heating source comprises a heating coil and a protective component, and the protective component is insulation material, and two ends of the heating coil are connected to a power source to receive voltages to generate heat, and the protective component is located on the heating coil to restrict a deformation range of the heating coil for restricting contact of two adjacent heater strips in the heating coil; and
   wherein the protective component further comprises an insulation lining, and the insulation lining is located between an inner wall of the heating coil and the heating container, and the insulation lining connects to each heater strip in the heating coil to restrict the deformation range of the heating coil for restricting the contact of the two adjacent heater strips in the heating coil.

2. The heating source according to claim 1, wherein the protective component comprises insulation bridges, and at least one insulation bridge is located between the two adjacent heater strips in the heating coil for restricting the contact of the two adjacent heater strips in the heating coil.

3. The heating source according to claim 2, wherein the insulation bridge is an insulation rigid uncut bar.

4. The heating source according to claim 2, wherein material of the insulation bridge is C/Csi composite material.

5. The heating source according to claim 2, wherein an included angle between the insulation bridge and the two adjacent heater strips is 90 degrees.

6. The heating source according to claim 1, wherein the heating source comprises a plurality of insulation linings, and the plurality of insulation linings are evenly distributed in an annular space between the inner wall of the heating coil and the heating container.

7. The heating source according to claim 1, wherein material of the insulation lining is C/Csi composite material.

8. An evaporator of organic light emitting diode, comprising a heating container and a heating source, and the heating source is located at an outer side of the heating container to heat the heating container, and the heating source comprises a heating coil and a protective component, and the protective component is insulation material, and two ends of the heating coil are connected to a power source to receive voltages to generate heat, and the protective component is located on the heating coil to restrict a deformation range of the heating coil for restricting contact of two adjacent heater strips in the heating coil; and
   wherein the protective component further comprises an insulation lining, and the insulation lining is located between an inner wall of the heating coil and the heating container, and the insulation lining connects to each heater strip in the heating coil to restrict the deformation range of the heating coil for restricting the contact of the two adjacent heater strips in the heating coil.

9. The evaporator according to claim 8, wherein the protective component comprises insulation bridges, and at least one insulation bridge is located between the two adjacent heater strips in the heating coil for restricting the contact of the two adjacent heater strips in the heating coil.

10. The evaporator according to claim 9, wherein the insulation bridge is an insulation rigid uncut bar.

11. The evaporator according to claim 9, wherein material of the insulation bridge is C/Csi composite material.

12. The evaporator according to claim 9, wherein an included angle between the insulation bridge and the two adjacent heater strips is 90 degrees.

13. The evaporator according to claim 8, wherein the heating source comprises a plurality of insulation linings, and the plurality of insulation linings are evenly distributed in an annular space between the inner wall of the heating coil and the heating container.

14. The evaporator according to claim 8, wherein material of the insulation lining is C/Csi composite material.

* * * * *